(12) United States Patent
Hsuan et al.

(10) Patent No.: US 6,512,708 B1
(45) Date of Patent: Jan. 28, 2003

(54) PLACEMENT AND ROUTING FOR WAFER SCALE MEMORY

(75) Inventors: Min-Chih Hsuan, Hsin Chu (TW); Tazsheng Feng, Hsin Chu (TW); Charlie Han, Hsin-Chu (TW); Cheng-ju Hsieh, Hsin-Chu (TW)

(73) Assignee: United Microelectronic Corporation, Hsin-Chu (TW)

( * ) Notice: Subject to any disclaimer, the term of this patent is extended or adjusted under 35 U.S.C. 154(b) by 0 days.

(21) Appl. No.: 09/981,650

(22) Filed: Oct. 16, 2001

(51) Int. Cl.[7] .................................................. G11V 7/00
(52) U.S. Cl. .......................... 365/200; 365/201; 714/5; 714/8
(58) Field of Search ................................ 365/200, 201, 365/230.03, 52, 63; 714/5, 8

(56) References Cited

U.S. PATENT DOCUMENTS

| | | | | | |
|---|---|---|---|---|---|
| 4,329,685 A | * | 5/1982 | Mahon et al. | ............... | 257/529 |
| 5,031,139 A | * | 7/1991 | Sinclair | ....................... | 712/15 |
| 5,105,425 A | * | 4/1992 | Brewer | ....................... | 365/200 |
| 5,576,554 A | * | 11/1996 | Hsu | .......................... | 257/207 |
| 6,408,402 B1 | * | 6/2002 | Norman | ....................... | 714/10 |

* cited by examiner

Primary Examiner—Son Mai
(74) Attorney, Agent, or Firm—Hogan & Hartson LLP

(57) ABSTRACT

An architecture for wafer scale memories and a placement method replaces defective chips with spare chips in a memory module so as to provide minimum critical signal delay. The SDRAM memory chips are classified into normal chips and spare chips, where the normal chips are formed into groups such as rows or columns, and the spare chips are used to replace defective normal chips. A delay model for metal lines and vias is used to compute the signal delay for placement and routing. The placement problem is modeled as a bipartite graph and solved using a branch and bound algorithm to obtain a chip replacement configuration having the shortest critical signal delay. Also described is a hierarchical routing approach, which classifies the signals into different types and levels of signals. During fabrication, the replacement of defective chips with spare chips is accomplished by using two extra conductive layers and patterning the extra layers using a mask that is independent of the defect distribution of a particular wafer.

12 Claims, 13 Drawing Sheets

L model

T model

π model

PLACEMENT AND ROUTING FOR WAFER SCALE MEMORY

BACKGROUND OF THE INVENTION

1. Field of the Invention

This invention relates to wafer scale memories, and in particular, to the selection of individual memories for inclusion within a final memory and to the placement and routing of interconnects within a wafer scale memory.

2. Description of the Related Art

Computers continue to demand larger memories. One strategy that has been used to provide large memories to computers is to configure the memories in memory modules, such as in single in line memory modules ("SIMM") or dual in line memory modules ("DIMM"). Memory modules are formed from discrete memory chips. Memories are manufactured and the resulting integrated circuit dies are placed on lead frames, wires are bonded between the lead frames and bonding pads on the dies and the resulting assembly is encapsulated or otherwise packaged to form the discrete memory chip. Memory modules integrate several to many of these discrete memory chips into a single unit by mounting the memory chips onto a printed circuit board (PCB). Interconnections and control lines are printed on the printed circuit board to allow the memory chips to be used as a single memory for the computer. Memory modules provide increased memory within a given surface area on the motherboard and are easier to use than a number of distinct memory chips. On the other hand, using memory modules can provide reduced performance due to the additional interconnections and printed wiring lines on the circuit board of the memory module.

Another strategy that might be used to provide larger memories is the use of wafer scale memories, in which memory dies are directly integrated at the wafer level to provide a larger memory. Wafer scale memories provide highly integrated memories with enhanced performance as compared to memory modules. To increase the manufacturing yield of wafer scale memories, after a wafer is produced, the memory chips on the wafer are routed to avoid defective chips contained in the wafer. Various wafer architectures and routing methods have been proposed. MacDonald, N. et al., "200 Mb Wafer Memory", Digest of Technical Papers. 36th ISSCC, 1989 describe a method in which a SPIRAL configuration is used to link the chips in series while skipping defective chips. Yamashita, K. et al., "A Design and Yield Evaluation Technique for Wafer-scale Memory", IEEE Transactions on Computer, April 1992, and Yamashita, K. et al., "Evaluation of Defect-tolerance Scheme in a 600 M-bit Wafer-scale Memory", Wafer Scale Integration Proceedings, 1991, describe methods in which the chips on a wafer are configured in columns, and each chip is equipped with a switching register to reconfigure the wafer. The switching registers are programmed to contain information about how to repair faulty circuits and reroute the chips.

To date, wafer scale memories have not received wide acceptance. It would be preferable to provide a more practical and simpler wafer scale memory.

SUMMARY OF THE INVENTION

To achieve these and other advantages and in accordance with the purpose of the present invention, as embodied and broadly described, the present invention provides a wafer scale memory architecture, an optimization method for obtaining optimum replacements for such an architecture, and a routing method for implementing the replacement.

Therefore, one aspect of the present invention is a wafer scale memory architecture in which the chips in a wafer scale memory module are classified into normal chips and spare chips, where the spare chips are used to replace defective normal chips, and where the critical signal delay for the memory module is minimized. A delay model for metal lines and vias is used to compute the delay for placement and routing.

Another aspect of the present invention is an optimization method of obtaining an optimum replacement configuration with the shortest critical delay for a module having given manufacturing data, including the defect bit map, chip pad map, module pad map, memory chip capacity and memory module capacity. According to the method, the placement problem is modeled as a bipartite graph, and solved by using a branch and bound algorithm to obtain optimal placement with minimum critical delay.

Another aspect of the present invention is a routing method for electrically connecting the replacement spare chips with normal chips in the memory module to effectuate the replacement. A hierarchical routing method is used in which routing is divided into module level routing and chip level routing. The method includes forming conductive connections among the chips in a wafer scale memory module and cutting unused connections.

It is to be understood that both the foregoing general description and the following detailed description are exemplary and explanatory and are intended to provide further explanation of the invention as claimed.

BRIEF DESCRIPTION OF THE DRAWINGS

Additional features and advantages of the invention are set forth in the description that follows and in part will be apparent from the description. The objectives and other advantages of the invention may be appreciated by the following description taken along with the drawings, which form a part of the description.

FIGS. 12–22 illustrate a routing method according to embodiments of the present invention:

FIG. 12 illustrates the distances of control signals from a module pad to a chip pad in a memory module.

FIG. 14 illustrates module level CS routing.

FIG. 16 illustrates module level DQ routing.

FIG. 17 illustrates control signal and power line routing.

FIG. 18 illustrates chip level CS routing for a normal chip.

FIG. 19 illustrates chip level CS routing for a spare chip.

FIG. 20 illustrates chip level DQ routing for a normal chip.

FIG. 21 illustrates chip level DQ routing for a spare chip.

FIG. 22 illustrates chip level routing of clock signal, other control signal and power line.

FIGS. 24A–24C show an exemplary replacement. FIG. 24A shows the defective chip distribution; FIG. 24B is an optimized replacement using the placement and routing methods according to embodiments of the present invention, and FIG. 24C is a non-optimized replacement.

FIGS. 25A–25C show another exemplary replacement. FIG. 25A shows the defective chip distribution; FIG. 25B is an optimized replacement using the placement and routing methods according to embodiments of the present invention, and FIG. 25C is a non-optimized replacement.

DETAILED DESCRIPTION OF THE PREFERRED EMBODIMENTS

Figure 1:
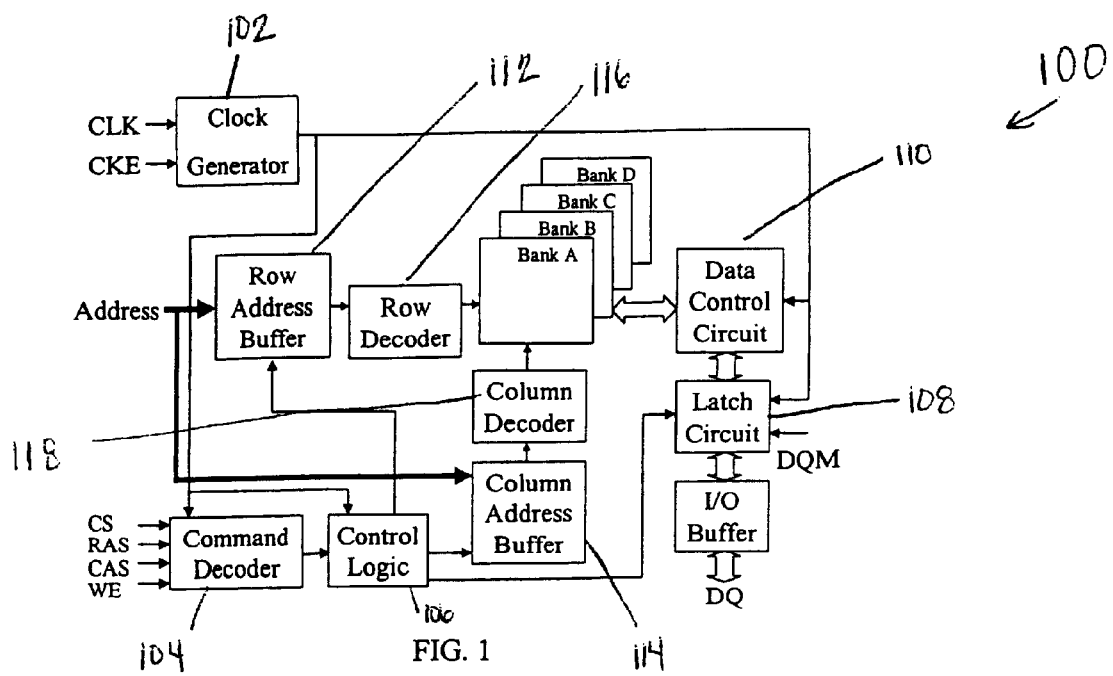
FIG. 1 illustrates the structure of an SDRAM memory chip.

FIG. 1 illustrates a synchronous dynamic random access memory (SDRAM), a well-known dynamic memory configuration that outputs data synchronized to a supplied clock signal. The following discussion is in terms of a wafer scale memory made up of SDRAMs that illustrates preferred placement and routing methods for the memory elements of a wafer scale memory. The described placement and routing methods are also applicable to wafer scale memories using other types of memory chips. Referring to FIG. 1, SDRAM 100 operates according to either the positive or negative edge of CLK (clock) signal to move signals through memory stages and to output data. CKE (clock enable) signal provides further control of the SDRAM in cooperation with the synchronous control by the CLK signal. When CKE is set to 0, the system clock is frozen and the state of the SDRAM does not change; when CKE is set to 1, the SDRAM is active and samples its various input signals according to the timing of the clock signal CKE. Both the CLK and CKE signals are supplied to the clock generator 102 that generates the control signals within the memory. The output of the clock generator 102 is provided to command decoder 104, control logic 106, latch circuit 108 and data control circuit 110. When the CS (chip select) signal is set to 1, all operations of the memory chip are in the normal mode. If the CS signal is set to 0, all inputs except CLK, CLE and DQM (data input/output mask) are masked to disable operation of the memory chip.

In the illustrated SDRAM, all address data including row address data and column address data are fed from the address pins in different clock cycles (i.e., time multiplexed), the address pins are preferably connected to a row address buffer 112 and a column address buffer 114. When the RAS (row address strobe) signal is set to 1, the address data are treated as row address data. If the CAS (column address strobe) signal is set to 1, the address data are treated as column address data. After being processed by a row decoder 116 or a column decoder 118, the address is computed, and used to read or write data. When the WE (write enable) signal is set to 1, the data inputted at DQ (data input/output) is written into the memory. If the WE signal is set to 1 and DQM (data input/output mask) is set to 1, the data output switches to high impedance so that the data cannot be written into any memory cell. If WE is set to 1 and DQM is set to 0, the write operation is activated. When the WE signal is set to 0, data are read out at DQ. VDD and VSS (not shown) are power and ground voltages for the input buffers and the control logic. VDDQ and VSSQ (not shown) are isolated power and ground voltages for the output buffers to improve noise immunity.

Figure 2:
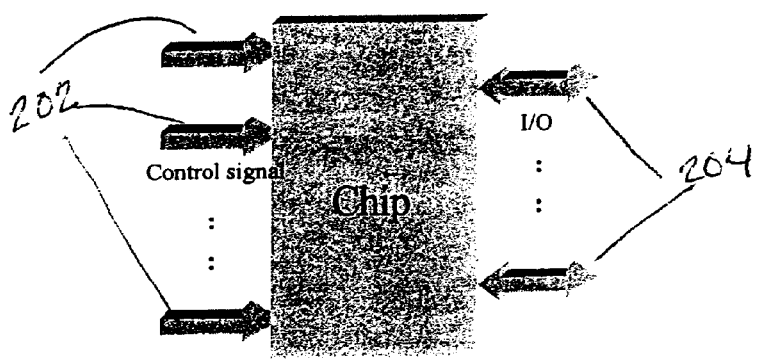
FIG. 2 shows the inputs/outputs of a memory chip.

A single memory chip 200 is shown in FIG. 2, where the arrows 202 represent the control inputs such as CLK, CS, CKE, Address, RAS, CAS, WE, DQM and the arrows 204 represent the data inputs/outputs such as DQi. All control signals and inputs/outputs are connected to the printed circuit board and interconnections are implemented by printed circuits. These connections are a bottleneck on performance of traditional memory modules.

Figure 3:
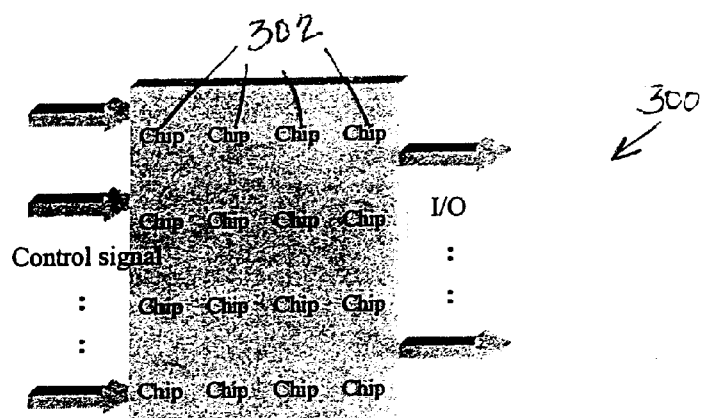
FIG. 3 shows the inputs/outputs of a wafer scale memory module.

An exemplary wafer scale memory module is shown in FIG. 3. The wafer scale memory module 300 contains a plurality of memory chips 302, and the number of pins in the wafer scale memory module 300 is the same as that of a single chip 302, except that the module has extra CS, DQM, and DQ pins. For example, an 8M*8 bit (2M*8 bit*4 banks) SDRAM chip and a 32M*64 bit SDRAM module containing 32 such 8M*8 bit SDRAM chips both have 1 bit CLK, 1 bit CKE, 1 bit RAS, 1 bit CAS, 1 bit WE, and 12 bit Address lines. The reason that a chip and a module have the same number of bits (12 bit) for Address lines is that a 12 bit address line can access 8 bit data in a chip and 8*8 bit (i.e., 64 bit) data in a memory module. As to the CS lines, there is only 1 bit CS in an SDRAM chip, but there are 4 bits CS in an SDRAM module. The reason is that the chips in an SDRAM module are divided into 4 groups with one CS signal for each group. In the optimal case, 2 bits of CS is sufficient to control 4 groups. However, if only 2 bit CS are used, additional control logic will be necessary; in other words, if only two chip select CS bits are provided, it is necessary to provide a multiplexer to decode the two bits of CS data. Requiring such a multiplexer is undesirable because the only resources available through the manufacturing process at the wafer level are additional metal connections and it is not possible to provide active logic circuitry. Hence, fully decoded chip select signals are preferred for use in accordance with the wafer scale memory architecture. The width of the CS signals in the illustrated embodiment is selected to be equal to the number of groups (i.e., 4). As to the DQ lines, an 8M*8 bit SDRAM chip has 8 bit DQ and a 32M*64 bit SDRAM module has 64 bit DQ. This is because there are 8 chips in each group, and the data output at each clock cycle is 8 times that of a single chip.

Three objectives are considered in wafer scale memory module designs: minimizing signal delay, minimizing the occupied area, and maximizing memory capacity. There are three cases for linear optimization in this system: minimize delay of the memory module when module area and module capacity are fixed; minimize the size of the memory module when the module delay and module capacity are fixed; and maximize the capacity of memory module when module time delay and module size are fixed. In practical situations, the size and capacity of a memory module are set by specifications. For example, the size is typically fixed by manufacturing concerns, economics and by the requirements of the applications. Also, the capacity of the memory module is typically fixed by the requirements of the application and extra capacity would be wasted. The present invention focuses on the problem of minimizing the delay of a memory module when the module area and capacity are fixed. The method illustrated here can also be applied to the other two linear optimization problems with minor modifications.

Figure 4:
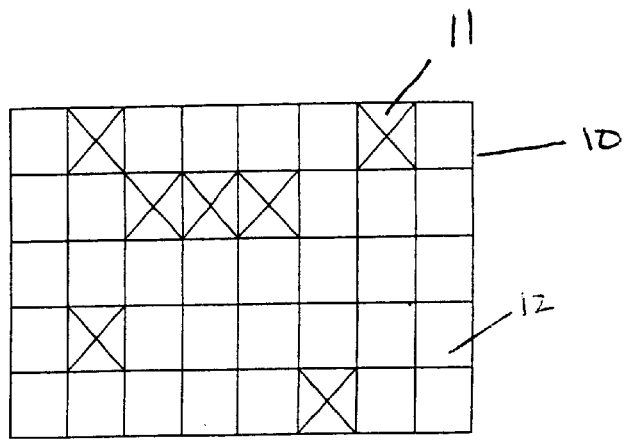
FIG. 4 is an exemplary wafer scale memory module to which the placement and routing methods according to the present invention may be applied.

Referring now to FIG. 4, a preliminary issue in the wafer architecture and method according to the present invention is to determine a feasible wafer region. That is, before cutting a wafer region to form a wafer scale memory module, it is preferable to determine if the region of the wafer can provide the desired capacity (i.e., it is feasible). If the region is not feasible (i.e., the region cannot provide the desired capacity), the wafer region should be modified or cut into single chips. FIG. 4 illustrates a region 10 containing forty memory chips 12 (8M*8 bits each), including seven defective chips 14. This regions is feasible for a 32M*64-bit memory module, because the available memory capacity is 33*8M*8 bits, which is larger than the specified capacity (32M*64 bits).

Figure 5:
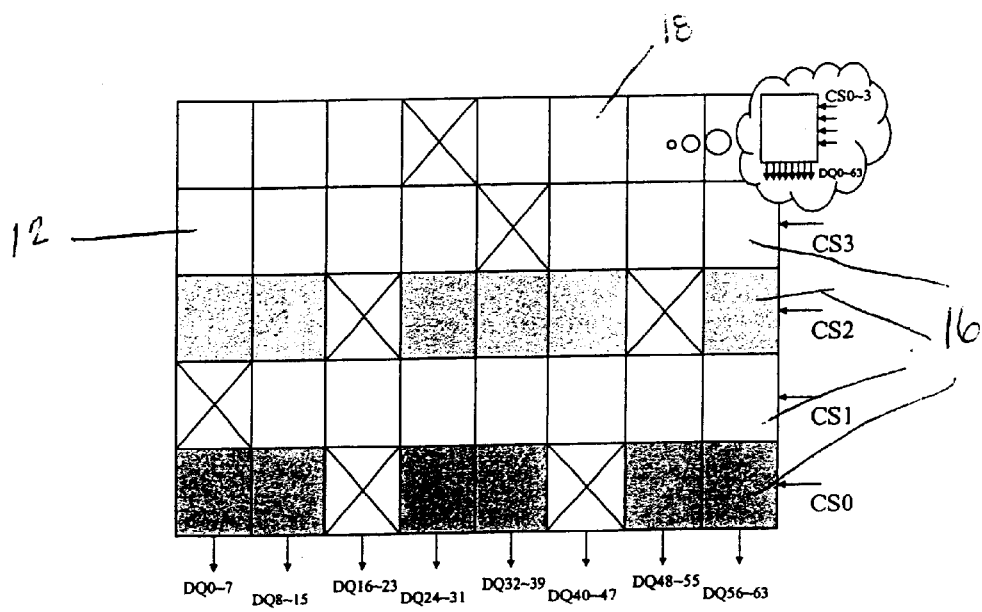
FIG. 5 illustrates a wafer scale memory architecture according to an embodiment of the present invention.

Architecture for a preferred wafer scale memory is described below with reference to FIG. 5. The memory chips 12 in this architecture are divided into two types: normal chips 16 located in the 4 lower rows that form the memory module, and spare chips 18 located in the top row that are used to replace defective normal chips. Both the normal chip region 16 and the spare chip region 18 may contain defective chips. The arrangement of normal and replacement chip regions in FIG. 5 is illustrative only, and different arrangements are possible, such as arranging the replacement chips in a row or column sandwiched between rows or columns of normal chips. In the memory module shown in FIG. 5, each row of normal chips forms a group of chips controlled by the same CS pin. The CS signal is used to select a group (row). A group is selected by setting the CS signal to 1, and the chips in the selected group operate in the same clock cycle. Setting the CS signals for the non-selected groups to 0 disables all chips in the non-selected groups. The I/O pins of the chips in the same column are connected together, and the operation of the chips in the same column depends on which group (row) is selected. In the illustrated embodiment, the chip capacity is 8M*8 bits and the specified module capacity is 32M*64 bits. Thus, a 5*8 block (5 rows and 8 columns) of chips is necessary for a module. The 8 chips in each row connect to the same CS line to form a group, and the 4 normal chips in each column are connect to the same I/O in order to input or output data in different cycles. The spare chips 18 in the top row are used to replace defective normal chips.

When replacing defective chips with spare chips within a wafer scale memory module, certain connections within the module become unnecessary and are preferably cut and other connections (e.g., via metal lines) become necessary and have to be made. First, unnecessary connections including the power lines and signal lines connected to the defective chips preferably are cut. Cutting the power lines reduces the current and power consumption of the module. Cutting the signal lines removes the input capacitance of the chips connected to the signal lines and improves the performance of the memory module. The signal line connections to be modified include CS, DQ and DQM. The CS signal of a spare chip is connected to that of the defective normal chip being replaced. The DQM signal of the spare chip is connected to that of the replaced normal chip to appropriately mask the spare chip for writing operations. The DQ signals of the spare chip are connected to the corresponding pads of the corresponding defective chip. Replacement of the defective normal chip by the spare chip is now complete.

"Placement" in the present context refers to assigning spare chips to the defective normal chips that need to be replaced. Because all operative normal chips are used in the memory module and assigned to a specific group, the chips that are subject to placement are spare chips. Any spare chip can be used to replace any defective normal chip. On the other hand, the placement of the spare chip with respect to the replaced defective normal chip affects the delay of the memory module. For example, a placement scheme may be undesirable if the distance between the module I/O terminals and the replacement memory chip I/O pads is too long, as it degrades the performance of the memory module. Therefore, efficiently placing the spare chips is a significant consideration for the placement phase of module design. Preferred aspects of the wafer scale memory architecture and layout strategy described here is to achieve a placement that minimizes delay. This may preferably be accomplished by modeling the problem as a bipartite matching problem and solving the problem using a branch and bound algorithm.

Figure 6A:
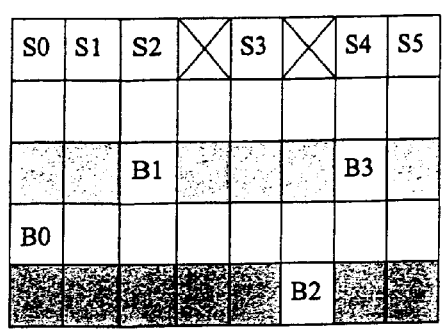
FIG. 6A illustrates a wafer module having defective chips.
Figure 6B:
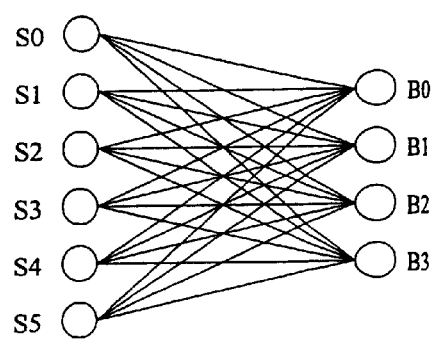
FIG. 6B is a corresponding bipartite graph according to an embodiment of the present invention.

In a bipartite matching problem, a feasible matching may be defined as a matching that satisfies the condition that for each defective normal chip, there exists a distinct spare chip to replace it. The weight of a feasible matching equals the maximum edge weight of the matching. According to this definition, one feasible matching corresponds to one solution for replacing each defective chip with a spare chip. For the defective chips and spare chips in a selected region, there exist several feasible matchings, and each matching is characterized by a different critical delay that determines the performance of the memory module. Critical delay is the longest signal delay among all the chip replacements for a particular matching. It is generally not useful to optimize other replacements if the one with the longest delay is not optimized. This, of course, assumes that all storage locations within the memory module are equivalent. Under this assumption, an optimum matching is one with the shortest critical delay. Using the example shown in FIG. 6A, the problem may be modeled as a bipartite graph $G=(S, B, E)$. The vertex sets S and B (FIG. 6B) represent the set of available spare chips ($S0, S1, \ldots$) and the set of defective normal chips ($B0, B1, \ldots$), respectively. The edge set E represents the replacement. Each edge $(i,j) \in E$, where $i \in S$ and $j \in B$, has a weight equal to the delay when a spare chip i is used to replace a defective chip j, i.e., the delay time between the DQ of the spare chip i and the DQ of the defective chip j. Using this representation, the placement problem is formulated as: Given the bipartite graph $G=(S, B, E)$ of a memory module, find a feasible matching such that the maximum weight of the matching is minimized.

The delay associated with each replacement is computed first. Delay models for conductors are known in the art. The following publications describe methods used for estimating delay associated with different conductor delay models: Campbell, M. L. et al., "3-D Wafer Scale Architectures for Neural Network Computing", IEEE Transactions on Components, Hybrids, and Manufacturing Technology, November 1993; Yamashita, K. et al., "A Wafer-scale 170000-gate FFT Processor with Built-in Test Circuits", Solid-State Circuits, IEEE Journal, April 1988; Mir-Fakhraei, N., "ATM Switching Architectures for Wafer-scale Integration", IEEE Transactions on Very Large Scale Integration (VLSI) Systems, December 1996; Peeters, J. et al., "Broadband Modeling and Transient Analysis of MCM Interconnections", IEEE Transactions on Advanced Packaging, May 1994; Narasimham, J. et al., "Yield Enhancement of Programmable ASIC Arrays by Reconfiguration of Circuit Placements", IEEE Transactions on Computer-Aided Design of Integrated Circuits and Systems, August 1994.

Figure 7A:
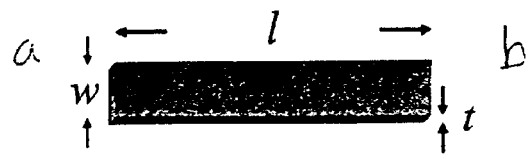
FIG. 7A depicts a metal line.
Figure 7B:
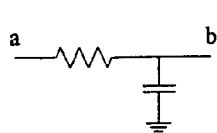
FIGS. 7B–7D are circuit models for the metal line.
Figure 7C:
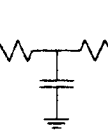
Figure 7D:
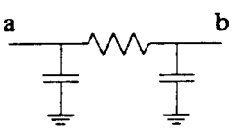

An appropriate delay model is described with reference to FIGS. 7A–7D. This model is presently preferred over the estimation strategies described in the above-listed publications. In a conductor line such as metal line having two ends a and b (FIG. 7A), a signal delay exists due to the parasitic resistance and capacitance effects of the metal line. The RC time constant of the metal line is the product of the equivalent resistance and the equivalent capacitance of the line. Equivalent circuit models for such a metal line include the L model, the T model, and the δ model, as shown in FIGS. 7B–7D, respectively. It is preferred that the delay of a metal line is calculated independently from other metal lines. If the assumption of independence is not adopted, the effect of other metal lines will mix with the delay of the metal line to be calculated and increase the complexity of the calculation without significant improvements in the accuracy of the model. The L model is described in more detail below, although the T and δ models or other suitable models can also be used in other implementations.

When calculating the delay of a metal line, it is preferable to consider the resistance effects and the capacitance effects. The resistance effects include the sheet resistance of the metal line and the sheet resistance of any via connecting metal lines. The capacitance effects include the area capacitance between the metal and the substrate and the fringing capacitance between the metal and the substrate. Assume that the metal line segment shown in FIG. 7A has a length l ($\mu$m), width w ($\mu$m), and thickness t ($\mu$m). If the metal line has a sheet resistance coefficient of $R_{SM}$ (ohm/sq), area capacitance coefficient between metal and substrate $C_{OA}$ (fF/$\mu$m$^2$), fringing capacitance coefficient between metal and substrate $C_{OF}$ (fF/$\mu$m), then the resistance $R_M$, area capacitance $C_A$, and fringing capacitance $C_F$ of the metal line are as follows:

$$R_M = \rho \frac{l}{A} = \frac{\rho}{t} \frac{l}{w} = R_S \frac{l}{w}$$

$$\begin{aligned} C_M &= C_A + C_F \\ &= C_{0A} * A + C_{0F} * 2l \\ &= C_{0A} * wl + 2C_{0F} * l \end{aligned}$$

As an example, if a metal line segment has typical values of l=20000 $\mu$m, w=3 $\mu$m, $R_{SM}$=0.05 ohm/sq, $C_{OA}$=0.038 fF/$\mu$m$^2$, and $C_{OF}$=0.043 fF/$\mu$m, the metal line segment will have an equivalent resistance $R_M$ of 333.3 ohm, an equivalent capacitance $C_M$ of 4 pF, and an RC time constant $R_M C_M$ of 1.33 nsec. These results show that the delay model is reasonable. Note that the equivalent capacitance of the metal line approaches the loading capacitance, so that the loading capacitance as well as the parasitic capacitance should be taken into consideration.

Figure 8A:
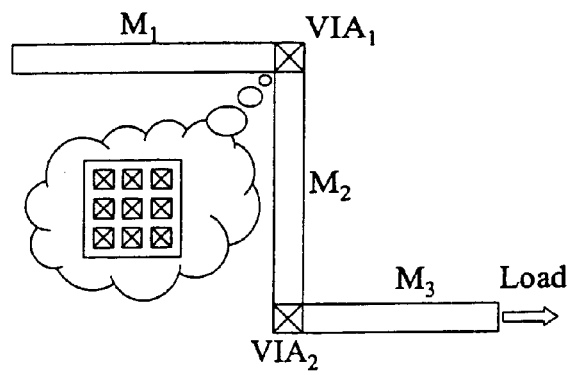
FIG. 8A shows a metal interconnection.

The resistance and capacitance effects also exist in a conductive via. FIG. 8A illustrates three metal lines M1, M2 and M3 linked by two via connections VIA1 and VIA2. Since the area of a via is much less than that of a metal line, the capacitance effect of the via can be omitted. The resistance effect of a via is also determined by the sheet resistance coefficient, and the equivalent resistance equation of the via is as follows:

$$R_{VIA} = \rho \frac{l}{A} = \frac{\rho}{t} \frac{l}{w}$$

$$= R_{SVIA} \frac{l}{w} = R_{SVIA}$$

In the above equation, it is assumed that the length l and width w of the via are equal (i.e., a square via, see FIG. 8A), and the equivalent resistance of the via is hence equal to the sheet resistance coefficient.

Figure 8B:
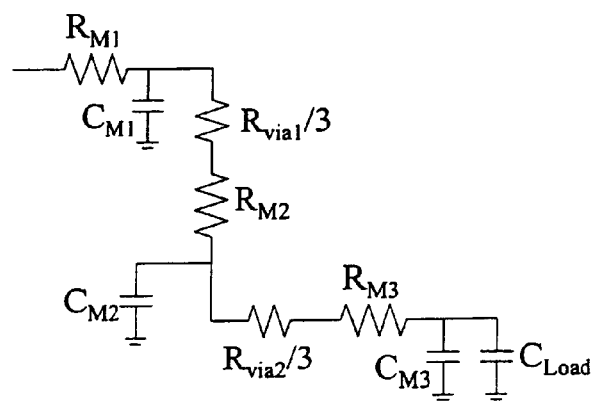
FIG. 8B is the corresponding circuit model.

In the example shown in FIG. 8A, the via connection VIA1 consists of nine individual vias. If the current flows from the line M1 to a line M2 on another layer, the current in the line M1 first flows through the three vias that are closest to the line M1, to the line M2 through these three vias. Unless the three vias closest to the line M1 are disconnected, almost all of the current goes through these three vias because of the added serial resistance to flow through the other vias. Thus, the resistance of the nine vias is substantially the same as that of three vias connected in parallel. The resistance of the via connection is thus equal to one-third of the resistance of an individual via $R_{via}$, even though there are nine individual vias in the via connection VIA1. In the example of FIG. 8A, after approximating the metal lines M1, M2 and M3 by the L model and replacing the via connections as parallel resistors, the equivalent circuit diagram of the connections is shown in FIG. 8B. In this circuit, the resistance of the via connection is much smaller than that of the metal line. Moreover, because of the routing arrangement (described later) of the wafer scale memory module, the number of via connections between the module inputs and the module outputs is relatively small. Consequently, the number of vias and their cumulative resistance is much smaller than the resistance of the metal lines and the via resistance can therefore be neglected.

The RC time constant of the metal connection in the circuit of FIG. 8B can be derived as follows. In this model, each metal line segment has resistance and capacitance characteristics related to its length, width, sheet resistance coefficient, area capacitance coefficient, and fringe capacitance coefficient, except that the last metal line segment should additionally be considered for the effect of the load capacitance. For the example shown in FIG. 6B, the delay is:

$$\begin{aligned} T_{total} &= \sum_i R_{Mi}(C_{Ai} + 2C_{Fi}) + R_E C_L \\ &= \sum_i \left[ R_S \frac{l_i}{w_i} * (C_{0A} A_i + 2C_{0F} l_i) \right] + R_S \frac{l_i}{w_i} * C_L \\ &= \sum_i \left[ R_S \frac{l_i}{w_i} * (C_{0A} w_i l_i + 2C_{0F} l_i) \right] + R_S \frac{l_i}{w_i} * C_L \\ &= \sum_i \left[ R_S C_{0A} + R_S C_{0F} \frac{2}{w_i} \right] l_i^2 + R_S \frac{l_i}{w_i} * C_L \end{aligned}$$

where $R_E = R_{M3}$ and $C_L = C_{M3} // C_{load}$. Using similar delay models, a bipartite graph such as FIG. 6B for a memory module can be built and each edge weight calculated.

After the bipartite graph is built, a branch and bound algorithm may solve the replacement problem between defective chips and spare chips. Referring to the example illustrated in a bipartite graph FIG. 9A, four spare chips S0, S1, S2 and S3 are available to replace three defective normal chips B0, B1 and B2. The delay penalty value 20 for each possible replacement is calculated using the delay model and shown in Table 1.

TABLE 1

Time delay between each pair of spare chip and defective chip.

|    | B0    | B1    | B2    |
|----|-------|-------|-------|
| S0 | 2.1 n | 2.4 n | 2.3 n |
| S1 | 3.1 n | 2.9 n | 2.6 n |
| S2 | 2.3 n | 2.5 n | 2.6 n |
| S3 | 2.9 n | 2.8 n | 2.0 n |

Figure 9A:
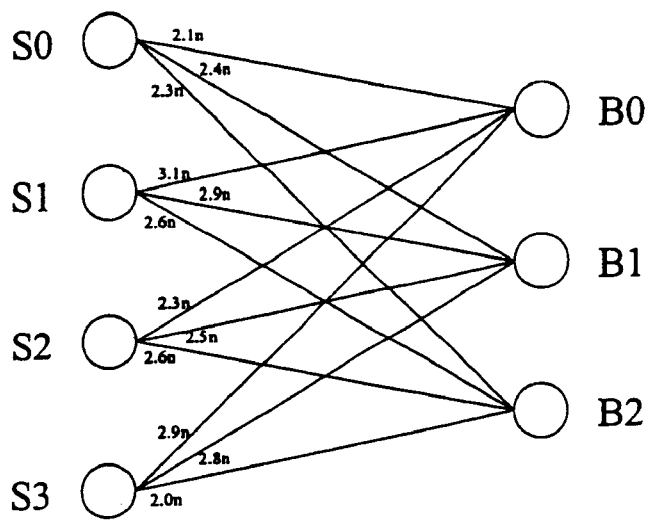
FIG. 9A is a bipartite graph.
Figure 9B:
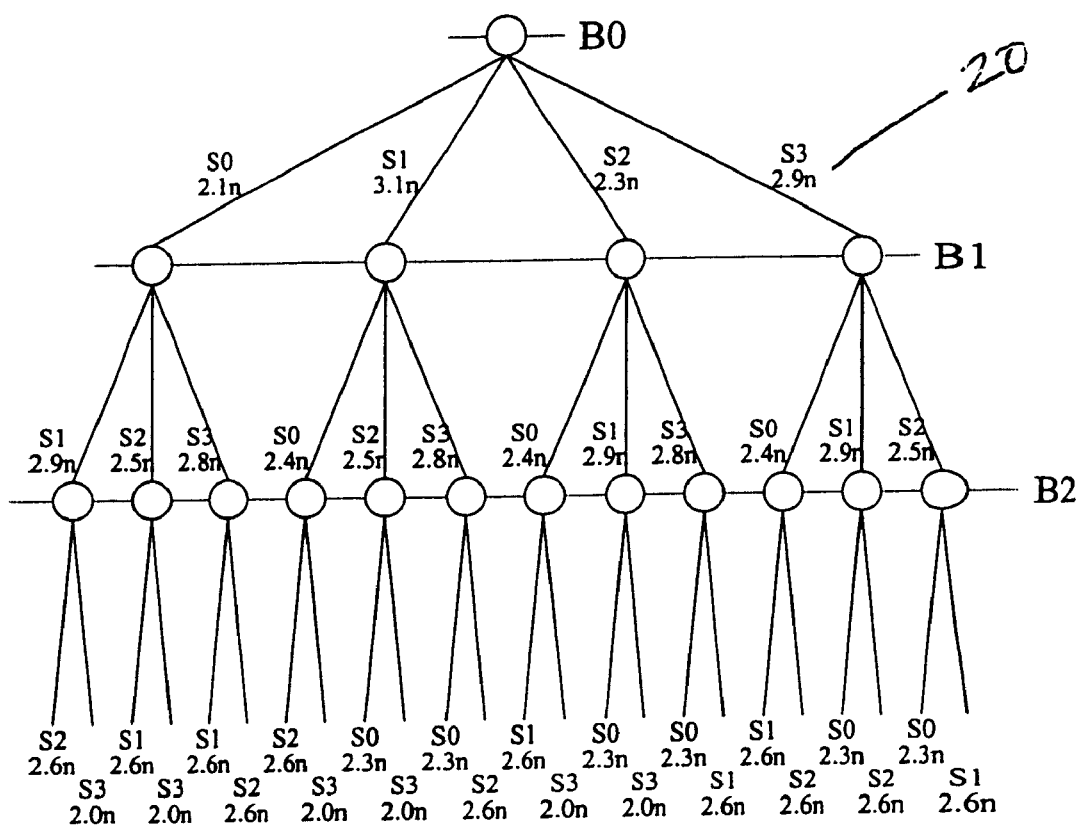
FIG. 9B is the corresponding decision tree according to an embodiment of the present invention.

The optimization problem corresponding to the bipartite graph of FIG. 9A may be solved using a branch and bound algorithm, illustrated as a decision tree shown in FIG. 9B, where defective normal chips B0, B1, . . . are referred to as decision nodes, and available spare chips S0, S1, . . . are referred to as branches. In the decision tree, each node represents a defective normal chip and the branches under the node represent the spare chips that are available to replace the particular defective chip. The weight (delay values 20) associated with each branch is the total delay from the DQ of that spare chip to the DQ of the module after the replacement is made. The weight is defined this way because the delay times from the inputs of the module to the I/Os of all the spare chips are the same. The delay from the module inputs to the spare chip inputs is dominated by the CLK signal. All chips in the exemplary SDRAM elements of the wafer scale memory module are activated at the positive edges or negative edges of CLK, so it is preferred that the CLK signal be the last signal that arrives at the spare chip. Otherwise, a data reading error occurs. In a preferred implementation of a routing scheme, the distances from the CLK input to the module and the CLK inputs to the spare chips are the same. In addition, because the chips have identical design, all of the chips exhibit the same delay from the chip CLK input to the chip DQ. Therefore, the weights in the bipartite graph preferably include only the delay between each spare chip and each normal chip, i.e., the delay from the spare chip DQ to the module DQ.

A classical branch and bound algorithm may be used to solve the bipartite graph. As outlined in the pseudo code in Table 2, the algorithm includes keeping track of the best solution up to any given point. If the weight of a branch is greater than the best solution at that point, the subtree is pruned under that branch. If a feasible matching has a smaller weight than the best matching does at that point, the best solution is updated by that feasible matching. After the branch and bound algorithm ends, the best matching and the minimized worst case delay (i.e. the weight for that matching) are obtained.

TABLE 2

The branch and bound algorithm for the placement problem

```
branch_and_bound( )
{
    proceed the left most matching;
    update the best_matching;
    update the max_weight;
    do{
        do{
```

TABLE 2-continued

The branch and bound algorithm for the placement problem

```
            if(edge weight>max_weight)
                break;
        }while(there are edges of the matching never proceeded);
        if(max_weight_of_the_matching<max_weight)
            update best_matching;
            update max_weight;
        proceed the next matching;
    }while(there are matchings never proceeded);
}
```

After the best matching between defective chips and spare chips is obtained, the routing phase is performed. To not change the design of constituent memory chip elements, two extra metal layers are added to the wafer scale memory module and are used for routing. If each wafer requires a different mask depending on the placement configuration, wafer scale memory modules production will be prohibitively expensive and thus impractical. Therefore, it is preferable to use the same masks to reduce cost. The masks should be flexible enough to accommodate variations in defect distribution and placement configuration of different wafers. In other words, the mask is independent of the defect distribution of particular wafers. Thus, all necessary metal lines are routed using the mask to fix the wafer design, and all unnecessary metal lines are subsequently cut according to the variation of wafer defects. Using this method, two special processes are required: forming extra metal layers above the wafer after chip formation, and laser cutting.

Figure 10:
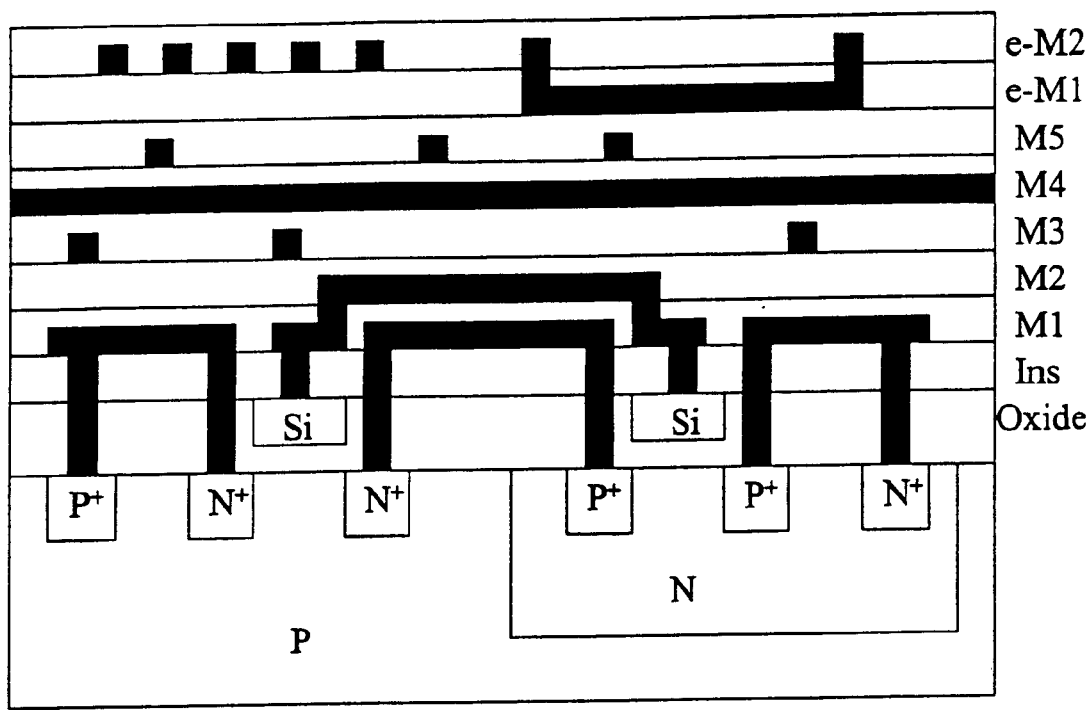
FIG. 10 shows the cross section of a CMOS device having five metal layers and two extra metal layers according to an embodiment of the present invention.

FIG. 10 illustrates the conductive layers for routing within the wafer scale memory. In FIG. 10, conductive layers (such as metal layers) M1 through M5 are fabricated in a conventional five metal layer process. The memory chip element of the die is completed at the layer M5 and the layers under it. The routing within the memory module is completed without changing this original memory circuit; rather, extra metal layers are used to accomplish the routing. Two extra metal layers e-M1 and e-M2 are used in the preferred embodiment, although the routing can also be done using a single extra metal layer. If only one extra metal layer is used for routing within the memory module, the routing will likely be complicated because not only all the control signals but also all the I/O lines must be routed. Even though the routing can be completed with only one extra metal layer, the lengths of the metal lines are likely to be very long in order to avoid the intersection of metal lines. This increases the delay associated with metal lines.

Figure 11:
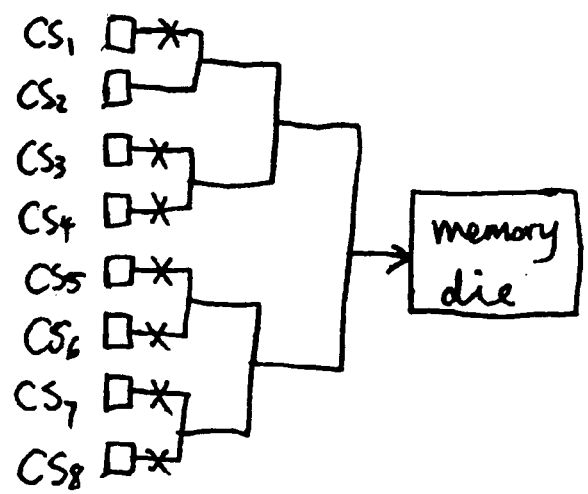
FIG. 11 illustrates a binary tree metal line routing and the corresponding laser cutting according to an embodiment of the present invention.

The masks for forming the extra metal layers are preferably designed to form all connections that may possibly be used for replacement within the memory module. After forming the extra metal layers, laser cutting preferably is used to cut the unnecessary connections. To ensure that the cutting does not affect the other connections, laser cutting preferably is used only for the extra metal lines. For example, if the chip should be connected to eight CS signal lines, the connection preferably is designed as a binary tree as shown in FIG. 11. To prevent the signals being shorted together, the number of cuts preferably is selected to be equal to the number of signal lines minus one.

The routing for a wafer scale memory includes two levels of routing: chip level routing and module level routing. The routing at the module level is categorized, according to signal types, into four types: (1) CLK signal, (2) CS signal, (3) DQ and DQM signals, and (4) other control signals and power line. CLK is the most placement and timing sensitive signal in an SDRAM because the CLK signal activates the SDRAM chip. If the CLK signal arrives at a chip earlier than any other signal, the values of the late signals fetched by the chip will be the value of these signals at the previous clock cycle, resulting in an error data fetch. Hence, the CLK signal preferably arrives before the other signals.

Figure 12:
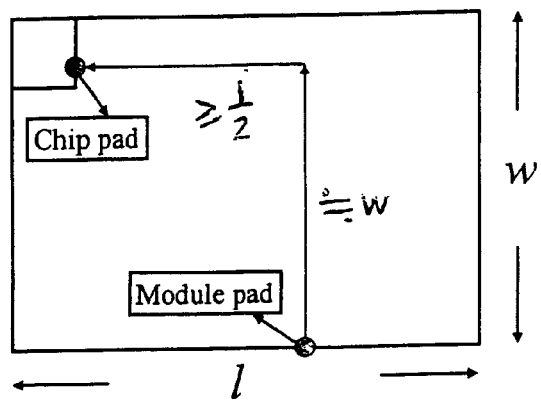

FIG. 12 shows that, for each signal, regardless of the side on which the module level signal pad is on the wafer, the longest distance between the module pad and the chip pad is at least l/2+w. Thus, the clock signal is preferably routed as an H-tree, since in such a layout the distance from the center of the H-tree to the clock pad of any normal chip is (l+w)/2. The total distance from the module clock pad to a normal chip clock pad then approaches (l+w)/2 plus the distance from the module clock pad to the center of the H-tree. For any given chip, if the delay from any module signal pad to the corresponding chip signal pad is less than the delay from the module level CLK pad to the chip level CLK pad, then the H-tree CLK routing can avoid erroneous data fetching. If this is not the case, then additional metal lines are preferably added to the CLK signal to increase the delay, so that the total delay of CLK signal is larger than the delay of the other control signals for that chip. If $w_{ai}$ and $l_{ai}$ are widths and lengths of the additional CLK signal line segments i for a chip, they preferably are chosen to satisfy the following condition:

$$\sum_{\substack{clockline \\ segment\ i}} \left[ R_S C_{0A} + R_S C_{0F} \frac{2}{w_{ci}} \right] l_{ci}^2 + \sum_{\substack{additional\ line \\ segment\ i}} \left[ R_S C_{0A} + R_S C_{0F} \frac{2}{w_{ai}} \right] l_{ai}^2 \geq$$

$$\max_{\substack{control \\ signal\ j}} \left\{ \sum_{line\ segment\ i} \left[ R_S C_{0A} + R_S C_{0F} \frac{2}{w_{ji}} \right] l_{ji}^2 \right\}$$

where $w_{ci}$ and $l_{ci}$ are the width and length of a clock signal (CLK) line segment i, $w_{ji}$ and $l_{ji}$ are the width and length of line segment i of control signal j, and $R_s$, $C_{OA}$, and $C_{OF}$ are as previously defined. In the above equation, the "Max" term is the longest module pad to chip pad delay among all control signalsj. Using the above equation, if the width of the additional CLK line segments are fixed, the lengths of the additional CLK line segments from the module level CLK pad to the center of the H-tree can be calculated.

Figure 13A:
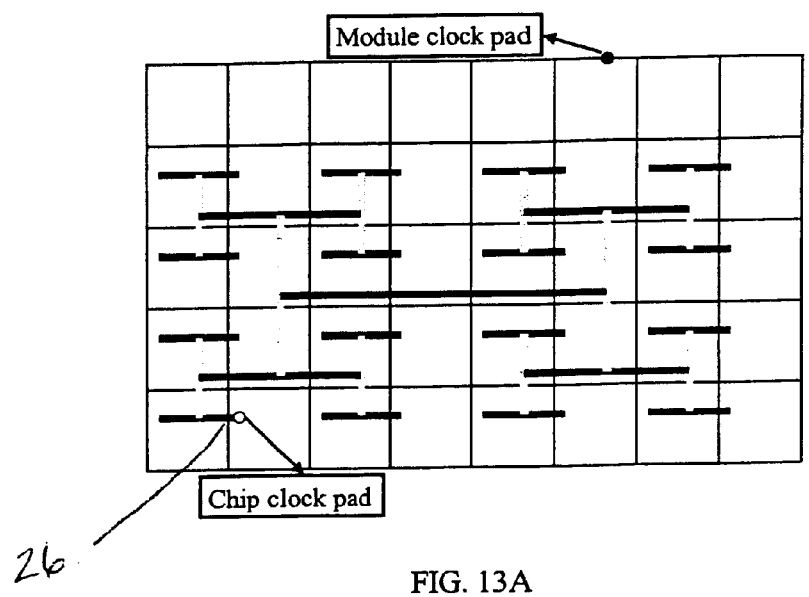
FIG. 13A illustrates an H-tree network for clock routing of normal chips.
Figure 13B:
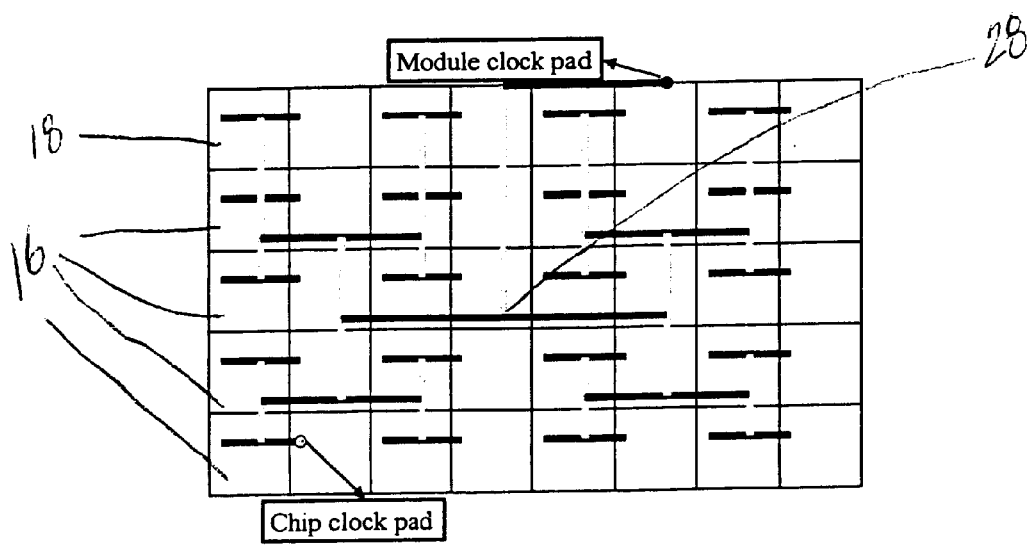
FIG. 13B illustrates H-tree-like network for clock routing of all chips.

The clock signal (CLK) of a normal chip preferably is routed as an H-tree as shown in FIG. 13A. The tails 26 of the illustrated H-tree are routed to the neighbor of the chip level CLK pads for the routing at chip level. After that, the center 28 of H-tree preferably is connected to the module CLK pad as shown in FIG. 13B.

Because the edge weight in the bipartite graph represents the delay from each spare chip I/O pad to the module I/O pad of the replaced defective chip, the distance from the module CLK pad to the I/O pad of each replaced spare chip are preferably the same. This may be accomplished by modifying the H-tree network to connect the CLK signal to the spare chips without affecting the precision of the delay. One preferred method is providing the clock signal (CLK) from the nearest normal chip 16 over two branches to each of the spare chips 18 as shown in FIG. 13B.

Figure 14:
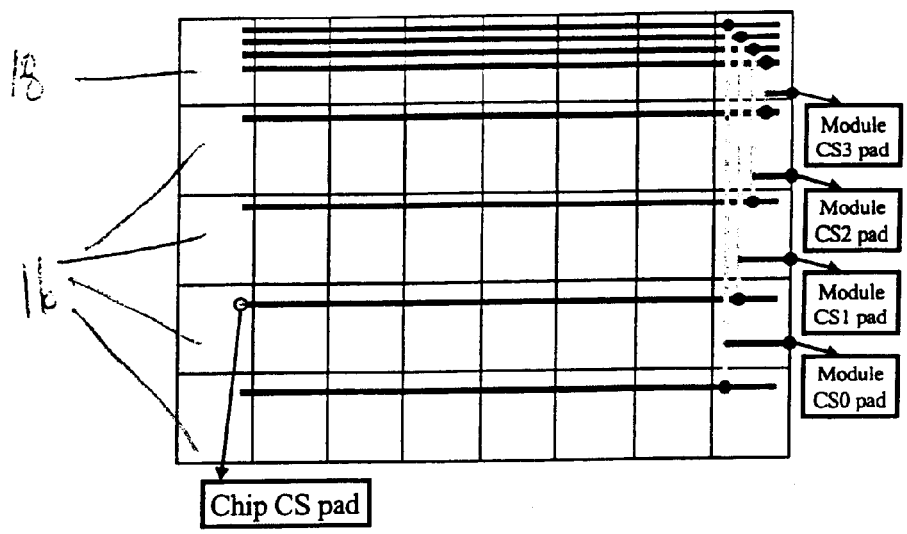
Figure 15A:
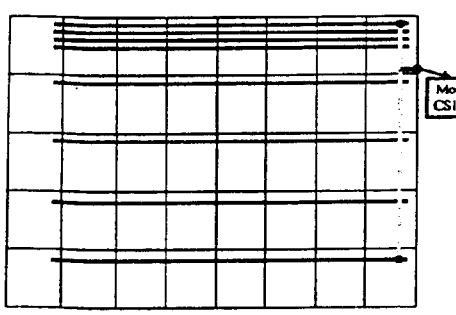
FIGS. 15A–15D illustrate module level CS routing based on the location of the module CS pads.
Figure 15B:
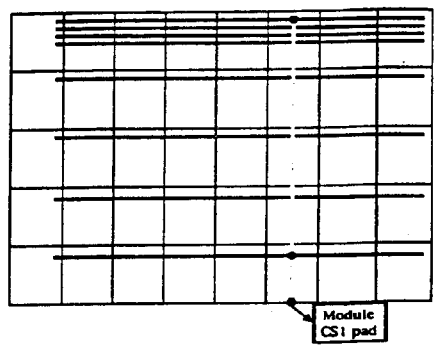
Figure 15C:
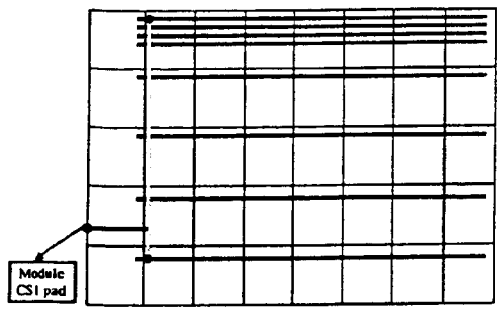
Figure 15D:
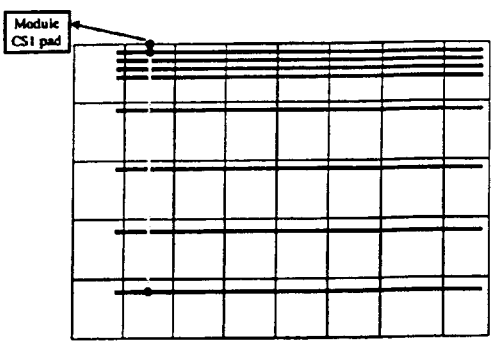

One example of routing for the CS signal is shown in FIG. 14. This figure shows the routing through the shortest connection between the module level CS pads and the chip level CS pads. This ensures that the CS signals arrive at each chip at a timing that avoids data fetch errors. According to a preferred architecture, each row of normal chips 16 forms one group. A normal chip is assigned to a group depending on the row to which it belongs. Module level routing is completed by routing the CS signal to the vicinity of each chip level CS pad. Since a spare chip 18 may potentially be assigned to any group, all the module level CS signal lines are routed to the vicinity of the chip level CS pad of each spare chip 18. Any unnecessary connections may be subsequently cut after the spare chip placement is determined.

In a preferred method of routing the CS lines, the lines in normal chips 16 first are routed group by group, all the CS signal lines of each group in the row of spare chips 18 are routed, and the corresponding CS lines are then connected with the module level CS pads. When connecting the module level CS pads to the module level CS signal lines, different connecting methods may be appropriate depending on the location of module level CS pads. FIGS. 15A–15D illustrate the connections when the module level CS pads are located at the right-hand side, at the bottom, at the left-hand side, and at the top of the module, respectively.

The routing of DQ and DQM at the module level is similar to the module level routing of CS. Routing through the shortest connection between the module level DQ pad and the chip level DQ pad ensures that the DQ signal arrives at each chip at a timing that should avoid erroneously fetching data. According to a preferred architecture, each column of chips uses the same module level I/O pad. A normal chip 16 is assigned to the module level I/O pad on the column to which the chip belongs. Routing the DQ signal to each chip level DQ pad completes the module level routing. Since a spare chip 18 may potentially be assigned to any normal chip 16 of a given group, the module level DQ signal lines are preferably routed to the vicinity of the chip level DQ pad of each spare chip 18. The unnecessary connections are then cut after the placement is determined.

Figure 16:
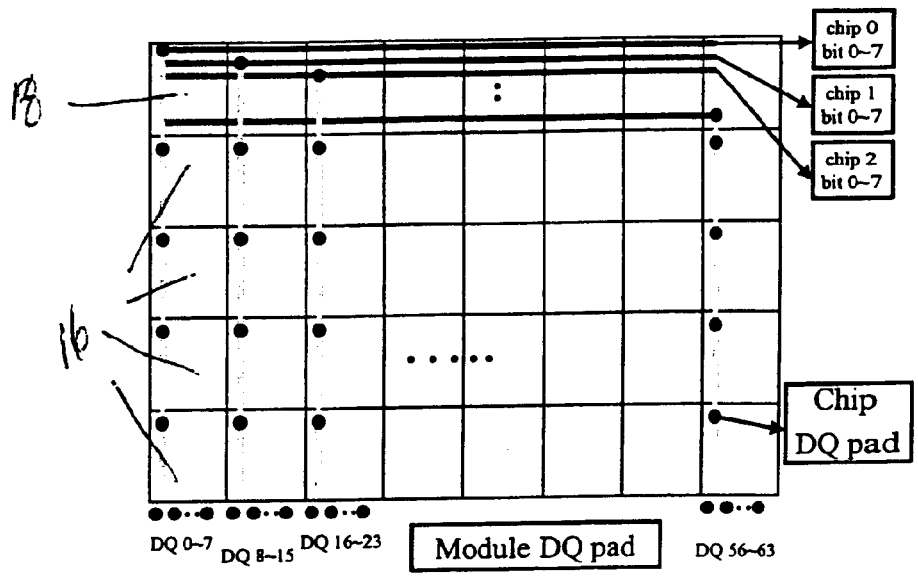

To route the DQ signal lines, the lines in normal chips 16 are first routed column by column, the DQ signal lines of each column in the spare row are routed, and the corresponding DQ lines are then connected with the module level DQ pad, as shown in FIG. 16. Again, when connecting the module level DQ pad to the module level DQ signal lines, different connecting methods may be appropriate depending on the location of module level DQ pad, as was discussed for the situation shown in FIGS. 15A–15D.

For chips belonging to the same group, data input or output occurs during the same clock cycle. When data are not to be written into certain chips, the DQM of these chips is set to 1 to set the DQ of these chips to a high impedance state. The routing of the DQM signal is substantially the same as the routing of the DQ lines, with the only difference being that the DQ signals concern all of the I/O bits of a chip, while the DQM signals concerns only one bit of each chip.

Figure 17:
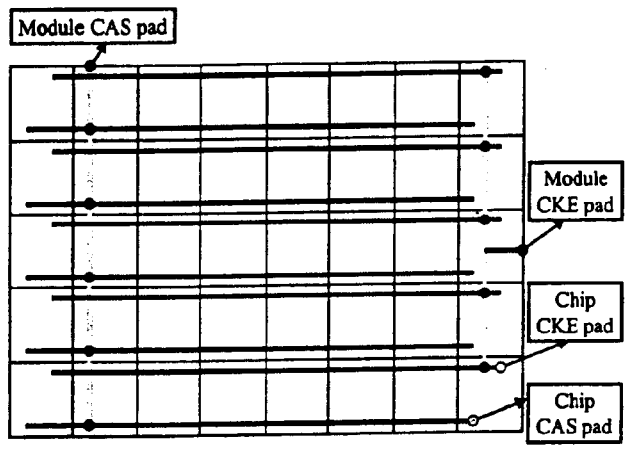

Control signal and power lines are routed to all normal as well as to all spare chips. Unnecessary control signal and power lines to unused or defective chips are subsequently cut. When routing signal lines, since the chip level pad of each signal is known, the module level signal is first routed to the vicinity of the chip level pad. The module level pad and module level signal are then connected together. Again, different connecting methods may be appropriate depending on the location of module level pads. The routing is done for each signal line and the power line, as shown in FIG. 17.

Chip level routing is described next. The signals are divided into three types of signals that may have different most appropriate routing methods: (1) CS signal, (2) DQ and DQM signal, and (3) CLK, other signals and power lines.

Figure 18:
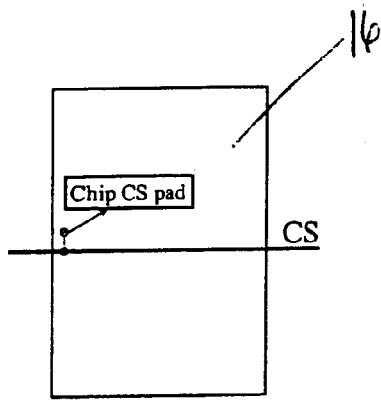
Figure 19:
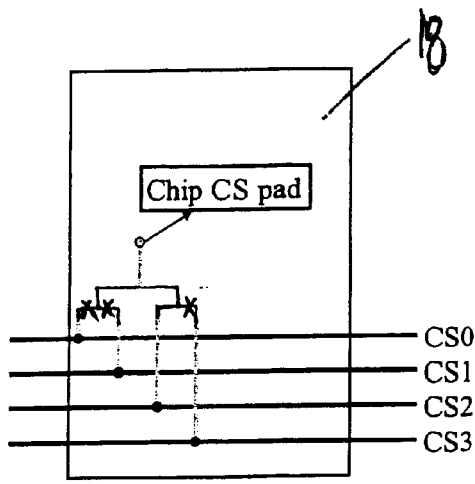

The CS signal routing for normal chips 16 is different from that for spare chips 18. For a normal chip 16, the chip level CS pad is connected to the module level CS signal line as shown in FIG. 18. For a spare chip 18, each spare chip may potentially be assigned to any group of normal chips. To be able to use the same mask for this routing process, the CS lines of a spare chip 18 are connected to all the module level CS signal lines. As shown in FIG. 19, assuming that there are 4 groups in the module, all the metal lines in the figure are pre-routed using the extra mask. The metal lines connecting the chip level CS pad to the module level signal lines are in the same layer, instead of in different layers, as would be the case in a strategy where the extra layer e-M1 is used for the horizontal metal layer and the extra layer e-M2 is used for the vertical metal layer. This is because, if different metal layers are used, metal vias between the layers generally connect the layers, which increases the probability of faulty wiring and delay time. When the same metal layer is used for the metal lines between chip level pad and module level signal lines, the space occupied by the metal lines is only $(2*4-1)*0.25\ \mu m=1.75\ \mu m$ in a 0.25 $\mu m$ process. By marking this region as used, other metal lines can be prevented from passing through. Unnecessary lines are subsequently cut. For example, as shown in FIG. 19, if the spare chip 18 is assigned to group 2, the connections from the chip level CS pad to the module level CS0, CS1, and CS3 signals are cut.

Figure 20:
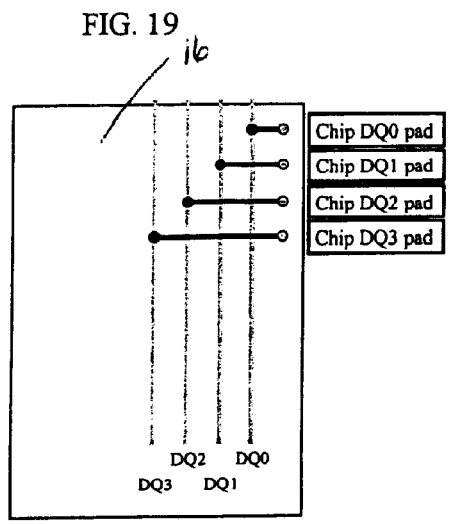
Figure 21:
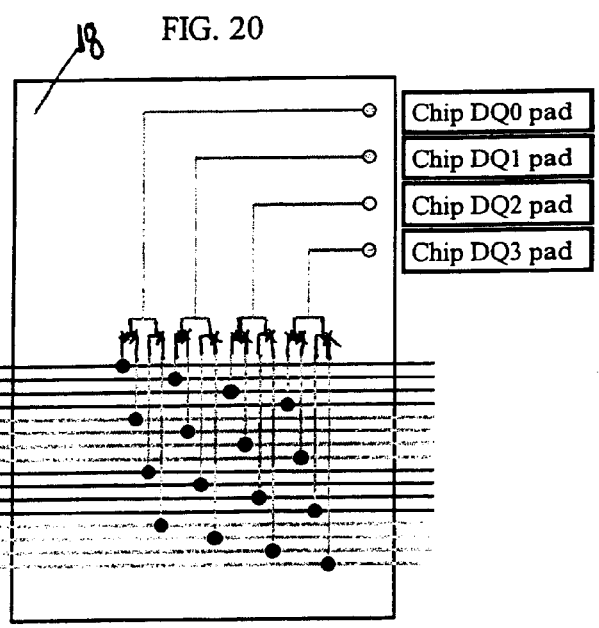

For the DQ lines, routing for normal chips is different from routing for spare chips. Normal chip DQ routing simply connects the chip level DQ pad to the module level DQ signal, as shown in FIG. 20. Each spare chip 18 may potentially be assigned to any chip of the group. To use the same mask in the routing process, the DQ lines of the spare chip 18 are connected to all the module level DQ signal lines. As shown in FIG. 21, assuming that there are 4 chips in each group, all metal lines are pre-routed using the extra mask. The metal lines from the chip level DQ pad to the module level signal lines are in the same layer for the reasons discussed earlier in connection with CS routing. Unnecessary lines are subsequently cut. For example, as shown in FIG. 21, if the spare chip 18 is assigned to the chip 2 of that group, the connections from each chip level DQ pad to the module level signal of chip 0, chip 1, and chip 3 are cut. The number of cuts is equal to (number of DQ per chip)*(number of chip in a group−1)=4*3=12.

Figure 22:
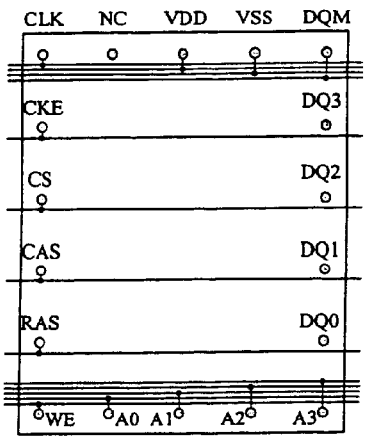

The chip level routing of DQM lines is the same as that of the DQ line, the only difference being that the DQ lines concern all of the I/O bits of a chip, while the DQM line only concerns one bit of each chip. The routing of the clock signal CLK, other control signal and power lines is done by simply connecting the chip level pad to the module level signal line as shown in FIG. 22.

Figure 23:
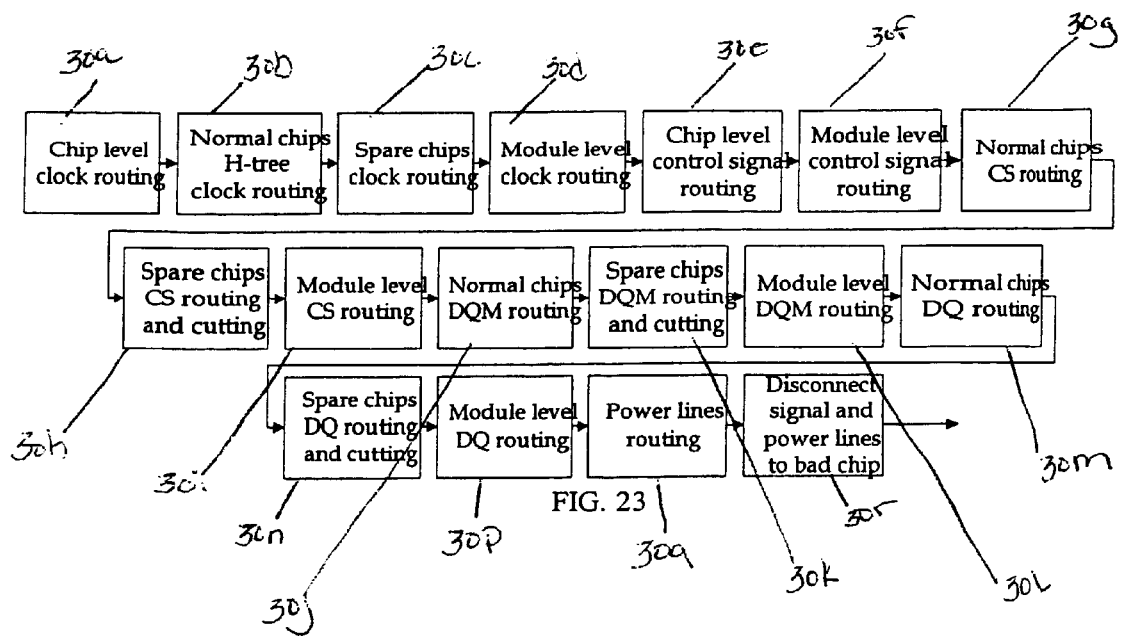
FIG. 23 is a flow chart showing the routing method according to an embodiment of the present invention.

The programming implementation of the routing phase is described next with reference to the flow chart shown in FIG. 23. Implementation in the C programming language is used as an example, but other programming languages can also be used.

To prevent the erroneous fetching of data, the CLK signals of the normal chips are routed at the module level as an H-tree (step 30b) after chip level CLK routing (step 30a). This avoids the track of the H-tree being occupied by other signals causing the H-tree to become unbalanced. For the same reason, the H-tree-like routing of the spare chip CLK signals is done next (step 30c). After module level CLK routing (step 30d), signals that have no complicated routing at the chip level, such as CKE, RAS, CAS, WE, and Address lines, are routed (steps 30e, 30f). The chip level lines of these signals are routed first (step 30e) by routing the chip level pads vertically to the horizontal module level signal lines without violating the design rule. After connecting the chip level signals of the same group in the horizontal direction, module level signals are connected to module level pads as shown in FIGS. 15A–15D.

CS signal routing is separated into normal chip CS routing (step 30g) and spare chip CS routing (step 30h). The routing strategy for the normal chip CS preferably is the same as the routing strategy of the control signals described above. The routing of spare chip CS is illustrated in FIG. 19; the chip level signal of CS is routed without violating the design rule. After determining the location of the module level CS signal lines, the CS lines of the same group are connected as shown in FIG. 14, and the module level signal lines are then linked to the module level CS pads (step 30i).

DQM signal routing preferably is also separated into normal chip DQM routing (step 30j) and spare chip DQM routing (step 30k). For normal chips, the chip level DQM pads are directly connected to the module level DQM signals, the DQM signals using the same I/O are connected together column by column, and the DQM signal of each column is connected to module level pad (step 30l). The routing of spare chip DQM is the same as that of CS. The connection of DQM signal lines in a spare chip with the module level DQM signal is as shown in FIG. 16. The routing for DQ (steps 30m, 30n and 30p) is the same as that for DQM, except that DQM routing concerns one bit per chip, and the DQ routing concerns a number of bits per chip.

The DC power lines such as VDD, VSS, VDDQ, and VSSQ are routed last (in step 30q), because the routing of DC power lines does not significantly affect performance, and because the power lines at the module level need the largest width. Therefore, the power lines are routed at the last step to prevent other signals from crossing them.

Some experimental simulation results are described next. The experiments were conducted using the programming implementation described above for implementing the strategies discussed above. The following standards were set for wafer yield in the experiments: For a memory module with eight groups, the yield is required to be above 88.9%; for a memory module with 16 groups, the yield is required to be above 94.1%. Different memory module sizes of 4*5 chips, 8*5 chips, and 8*9 chips are tested, and different defect bit maps and the number of defective chips are tested for each module size.

The experimental results are shown in Tables 3A–3C below. In each of the tables, the first row indicates the samples. The second and third rows indicate the size of the module. The fourth row indicates the number of defective (bad) chips in the module. The remaining three rows indicate the placement time, the routing time and the total time (replacement plus routing).

TABLE 3A

Experimental results for modules with 4*5 chips

| | Module 1 | Module 2 | Module 3 | Module 4 | Module 5 | Module 6 |
|---|---|---|---|---|---|---|
| Group | 4 | 4 | 4 | 4 | 4 | 4 |
| Chip/group | 4 | 4 | 4 | 4 | 4 | 4 |
| Bad chip | 3 | 3 | 3 | 4 | 4 | 4 |
| Placement time | 0.02 s | 0.02 s | 0.01 s | 0.02 s | 0.02 s | 0.01 s |
| Routing time | 0.13 s | 0.12 s | 0.14 s | 0.13 s | 0.13 s | 0.15 s |
| Total time | 0.15 s | 0.14 s | 0.15 s | 0.15 s | 0.15 s | 0.16 s |

TABLE 3B

Experimental result of module with 8*5 chips

|  | Module 1 | Module 2 | Module 3 | Module 4 | Module 5 | Module 6 |
|---|---|---|---|---|---|---|
| Group | 4 | 4 | 4 | 4 | 4 | 4 |
| Chip/group | 8 | 8 | 8 | 8 | 8 | 8 |
| Bad chip | 6 | 6 | 7 | 7 | 8 | 8 |
| Placement time | 0.06 s | 0.27 s | 0.42 s | 1.10 s | 3.40 s | 10.43 s |
| Routing time | 0.56 s | 0.56 s | 0.68 s | 0.56 s | 0.61 s | 0.79 s |
| Total time | 0.62 s | 0.83 s | 1.10 s | 1.66 s | 4.01 s | 11.22 s |

TABLE 3C

Experimental result of module with 8*9 chips

|  | Module 1 | Module 2 | Module 3 | Module 4 | Module 5 | Module 6 |
|---|---|---|---|---|---|---|
| Group | 8 | 8 | 8 | 8 | 8 | 8 |
| Chip/group | 8 | 8 | 8 | 8 | 8 | 8 |
| Bad chip | 6 | 6 | 7 | 7 | 8 | 8 |
| Placement time | 0.06 s | 0.24 s | 0.53 s | 0.71 s | 4.85 s | 8.76 s |
| Routing time | 1.10 s | 1.11 s | 0.54 s | 0.58 s | 0.65 s | 0.75 s |
| Total time | 1.16 s | 1.35 s | 1.07 s | 1.29 s | 5.50 s | 9.51 s |

These results show that the complexity of the placement phase is proportional to the number of defective chips, and the routing phase has linear time complexity with respect to the number of chips per module.

Figures 24A, 24B, 24C:
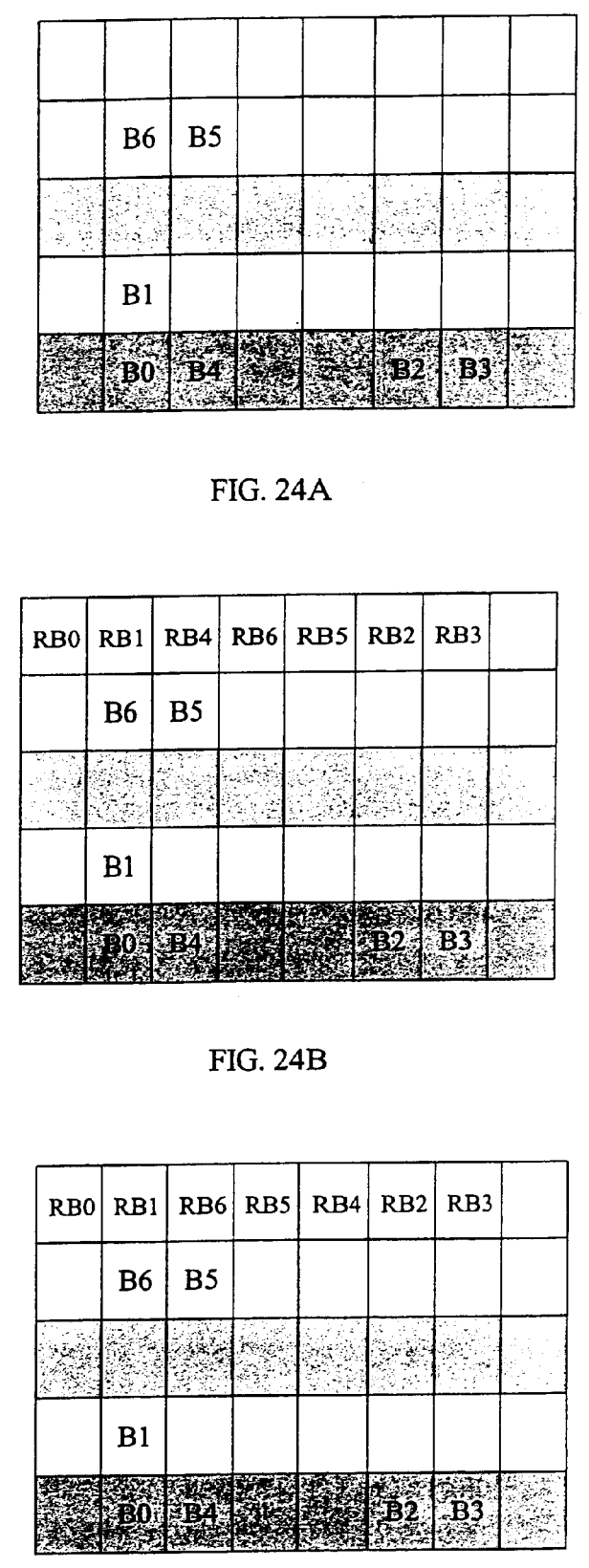

As an example, the replacement result of Module 3 in Table 3B is shown in FIGS. 24A–24C. The distribution of the defective chips is shown in FIG. 24A, where B0–B6 represent defective chips. In a replacement method that only allows replacement to be done for chips in the same column, the defective chips cannot be replaced successfully because there is more than one defective chip in some columns. Using an algorithm as described above, the best replacement solution is obtained as shown in FIG. 24B. In FIGS. 24B and 24C, RB0, RB1 . . . represents a replacement of defective B0 by a spare chip RB0, etc. FIG. 24C is a replacement that may be intuitive, but the delay of module routing is increased by 13.2% over the placement of FIG. 24B. In other words, the performance dropped to 88.3% of that of the optimum placement of FIG. 24B.

Figures 25A, 25B, 25C:
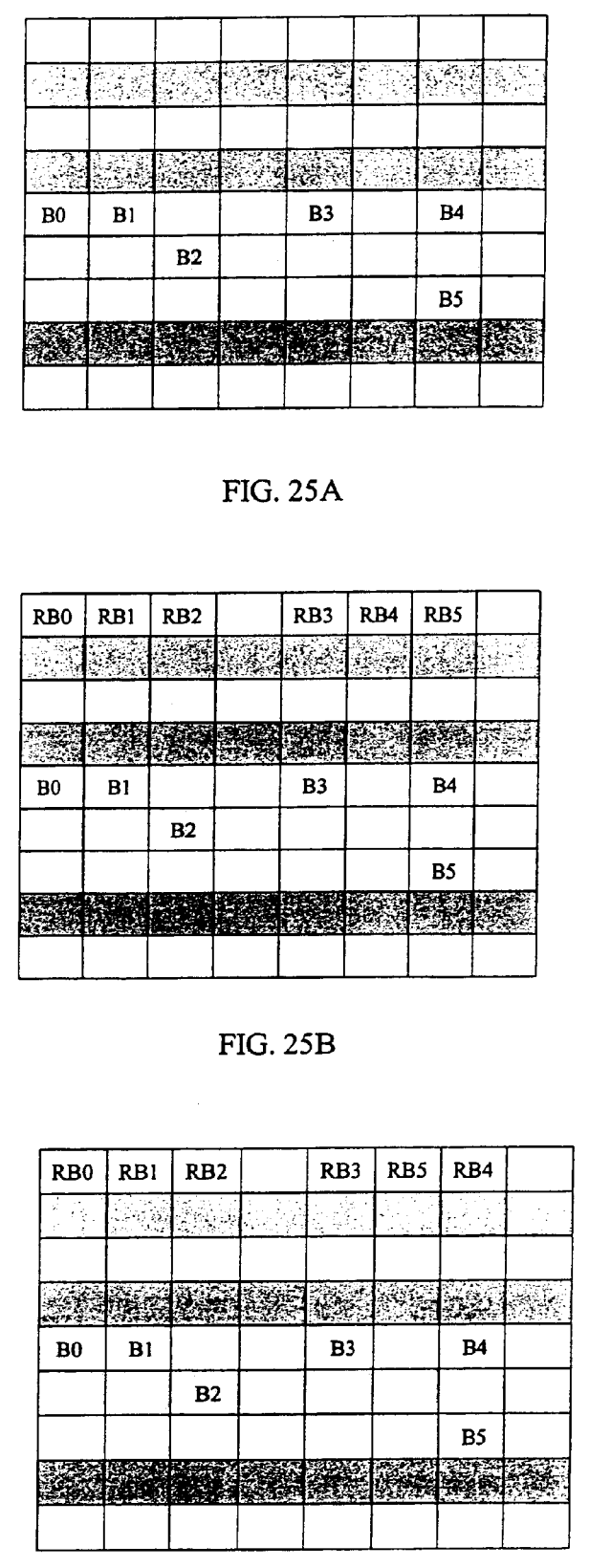

Another example, the replacement result of Module 2 of Table 3C, is shown in FIGS. 25A–25C. Again, FIG. 25A shows the defective chip distribution, FIG. 25B shows an optimum replacement obtained using embodiments of the present invention, and FIG. 25C shows a non-optimum replacement. The non-optimum replacement has a module routing delay that is 2.3% higher than that of the optimum replacement. In other words, the performance is 97.8% of that of the optimum placement.

Figure 26:
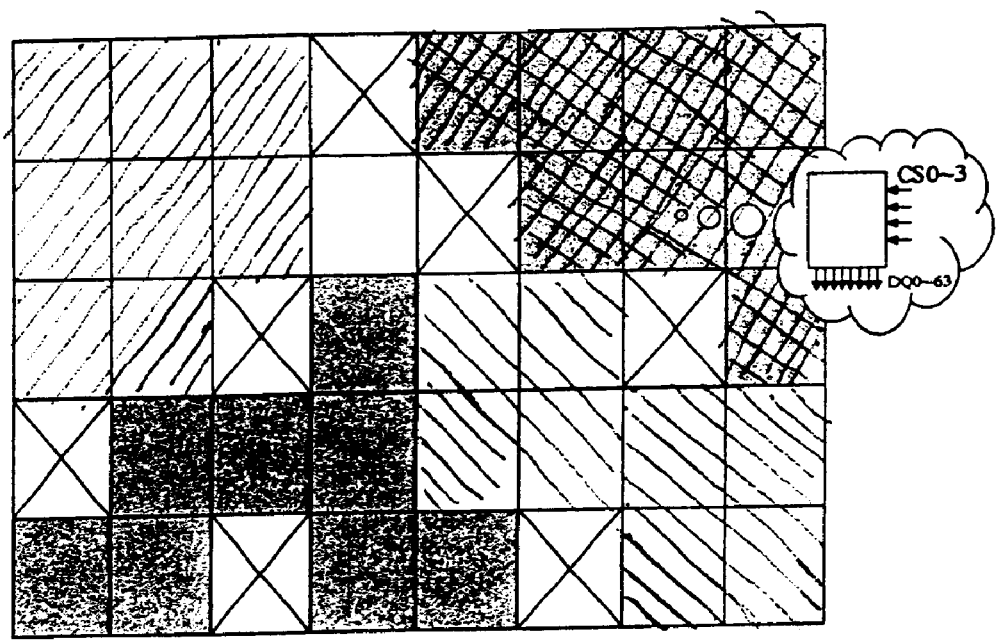
FIG. 26 illustrates an extended wafer scale memory module architecture according to another embodiment of the present invention.

In the architecture described above (referred to as the original architecture), normal chips are assigned to specific groups such as rows. This limits the possible solution for optimal matching. An alternative architecture (referred to as the extended architecture) is described below, which further optimizes placement and reduces critical delay. In the extended architecture, all good (non-defective) chips may be used to form the memory module. The arrangement of good chips is based on the concern of delay without any limitation with regard to their location on the wafer. FIG. 26 illustrates an example of the extended architecture, in which the eight chips in each of the areas 32a–d indicated by different hatching patterns are grouped together. The placement method for the extended architecture is modified from that for the original architecture, because the number of good chips to be placed in the extended architecture is much larger than the number of spare chips to be placed in the original architecture. The routing method of the extended architecture is the same as that for the spare chips in the original architecture.

In the extended architecture, the arrangement of good chips is more flexible, so the critical delay is shorter than that of the original architecture. The extended architecture, however, may require a larger number of laser cuts. In the original architecture, laser cutting is used on the signal lines of unused and defective chips, and to the CS, DQM, and DQ signal lines of spare chips. In the extended architecture, laser cutting is applied to the signal lines of unused and defective chips, and to the CS, DQM, and DQ signal lines of all chips, rather than just the spare chips. In addition, the software runtime for calculating the placement is longer for the extended architecture. In the original architecture, only the placement of the spare chips is optimized, but in the extended architecture, the placement of all good chips including the normal chips must be optimized. Table 4 summarizes the comparison of the two architectures.

TABLE 4

Comparison of the original and the extended architectures

|  | Original Architecture | Extend Architecture |
|---|---|---|
| Flexibility | Fixed | Flexible |
| Laser cutting number | Low | High |
| Solving time | Low | High |
| Critical delay | High | Low |

It will be apparent to those skilled in the art that various modifications and variations can be made in a method of chip placement and routing of the present invention without departing from the spirit or scope of the inventions. Thus, it is intended that the present invention cover modifications and variations of this invention that come within the scope of the appended claims and their equivalents.

What is claimed is:

1. A wafer scale memory module comprising:

a substrate;

a plurality of memory chips formed on the substrate, including a plurality of normal chips and a plurality of spare chips, each memory chip being a defective chip or a non-defective chip, wherein each defective normal chip is assigned a non-defective spare chip as a replacement;

conductive lines connecting each non-defective normal chip to a predetermined set of signals depending on the location of the chip on the memory module; and conductive lines connecting each replacement spare chip to a set of signals depending on the location of the corresponding defective normal chip, wherein the conductive lines have signal delay characteristics and collectively define a critical signal delay, and wherein the assignments of spare chips to defective normal chips define a placement that has the shortest critical signal delay among all possible placements.

2. The wafer scale memory module of claim 1, wherein the normal chips form a plurality of groups, each group being a row or a column of memory chips formed on the substrate.

3. The wafer scale memory module of claim 1, wherein the memory chips are SDRAM chips and the set of signals include one or more signals selected from the group consisting of a clock signal, a clock enable signal, a chip select signal, a row address strobe signal, a column address strobe signal, a write enable signal, a data input/output signal, and a data input/output mask signal.

4. A method for forming a wafer scale memory module, comprising:

forming a plurality of memory chips on a substrate, including a plurality of normal chips and a plurality of spare chips;

identifying defective ones among the memory chips formed on the substrate; and determining an optimum placement that assigns a non-defective spare chip to each defective normal chip, the optimum placement having the shortest critical signal delay among all possible placements.

5. The method of claim 4, wherein the normal chips are formed into a plurality of groups, each group being a row or a column of memory chips formed on the substrate.

6. The method of claim 4, wherein the memory chips are SDRAM chips adapted to be connected to one or more signals selected from the group consisting of a clock signal, a clock enable signal, a chip select signal, a row address strobe signal, a column address strobe signal, a write enable signal, a data input/output signal, and a data input/output mask signal.

7. The method of claim 6, wherein the step of determining an optimum placement comprises:

calculating a signal delay value for each possible assignment of a non-defective spare chip to a defective normal chip;

constructing a bipartite graph in which a vertex set is a set of all non-defective spare chips and another vertex set is a set of all defective normal chips, and an edge set is a set of the signal delay values of the assignments calculated in the calculating step; and obtaining an optimum solution of the bipartite graph using a branch and bound algorithm, the optimum solution defining the optimum placement having the shortest critical signal delay.

8. The method of claim 7, wherein the step of calculating a signal delay value for an assignment comprises:

constructing a delay model for conductive line segments formed on the substrate;

determining a geometry of conductive lines connecting the non-defective spare chip to signals for the corresponding defective normal chip; and calculating the signal delay value for the conductive lines based on the delay model and the geometry.

9. The method of claim 4, further comprising:

connecting each non-defective normal chip to a predetermined set of signals depending on the location of the normal chip on the memory module; and connecting each non-defective spare chip assigned to a defective normal chip to a set of signals depending on the location of the defective normal chip on the memory module.

10. The method of claim 9, wherein the step of connecting the non-defective spare chip to a set of signals comprises:

forming at least one extra conductive layer on the substrate over layers formed during the step of forming the memory chips;

patterning the extra conductive layer using a mask having a mask pattern that is independent of the placement of spare chips; and cutting unnecessary connections in the patterned conductive layer depending on the placement of spare chips.

11. The method of claim 10, wherein the memory chips are SDRAM chips, the method further comprising a routing process implemented in a programmed computer, including the following ordered steps:

routing a clock signal at the chip level;

routing the clock signal for normal chips at the module level;

routing the clock signal for spare chips at the module level;

routing control signals at the chip level;

routing the control signals at the module level;

routing chip select signals for normal chips at the chip level;

routing the chip select signals for spare chips at the chip level and removing unnecessary routing lines depending on the placement;

routing the chip select signals at the module level;

routing data input/output mask signals for normal chips at the chip level;

routing the data input/output mask signals for spare chips at the chip level and removing unnecessary routing lines depending on the placement;

routing the data input/output mask signals at the module level;

routing data input/output signals for normal chips at the chip level;

routing the data input/output signals for spare chips at the chip level and removing unnecessary routing lines depending on the placement;

routing the data input/output signals at the module level;

routing power lines; and removing power lines and all signals to the defective chips.

12. The method of claim 11, wherein the clock signal routing steps include forming an H-tree-like pattern to connect a clock signal to all the memory chips, and forming additional conductive lines connected between a module clock pad and a center of the H-tree, wherein the delay induced by the additional conductive lines introduces sufficient delay to the clock signal to prevent error fetching.

* * * * *